(12) United States Patent
Walenta et al.

(10) Patent No.: US 8,825,460 B2
(45) Date of Patent: Sep. 2, 2014

(54) DEVICE AND METHOD FOR THE SIMULATION OF A DEVELOPMENT SYSTEM

(75) Inventors: Mario Walenta, Graz (AT); Martin Klöckl, Gralla (AT); Manfred Krainz, Graz (AT)

(73) Assignee: Avl List GmbH, Graz (AT)

( * ) Notice: Subject to any disclaimer, the term of this patent is extended or adjusted under 35 U.S.C. 154(b) by 0 days.

(21) Appl. No.: 12/452,011

(22) PCT Filed: Sep. 6, 2008

(86) PCT No.: PCT/EP2008/057134
§ 371 (c)(1),
(2), (4) Date: Mar. 29, 2010

(87) PCT Pub. No.: WO2008/152010
PCT Pub. Date: Dec. 18, 2008

(65) Prior Publication Data
US 2010/0191515 A1    Jul. 29, 2010

(30) Foreign Application Priority Data

Jun. 14, 2007    (AT) ................ GM366/2007

(51) Int. Cl.
| | | |
|---|---|---|
| G06G 7/48 | (2006.01) | |
| G01M 17/00 | (2006.01) | |
| G06F 17/50 | (2006.01) | |
| G05B 17/02 | (2006.01) | |

(52) U.S. Cl.
CPC .......... *G01M 17/00* (2013.01); *G06F 17/5095* (2013.01); *G05B 17/02* (2013.01); *G05B 2219/23446* (2013.01); *Y02T 10/82* (2013.01)
USPC .................................. 703/8; 703/7

(58) Field of Classification Search
CPC ..................................... G06F 17/5095
USPC ....................................... 703/7, 8
See application file for complete search history.

(56) References Cited

U.S. PATENT DOCUMENTS 5,657,227 A * 8/1997 Freitag .................. 701/29.1
6,714,852 B1 * 3/2004 Lorenz et al. ............ 701/102
(Continued)

FOREIGN PATENT DOCUMENTS

| AT | 505326 | 12/2008 |
| DE | 102007039691 | 2/2009 |

(Continued)

OTHER PUBLICATIONS

Modeling and Simulation of Various Hybrid-Electric Configurations of the High-Mobility Multipurpose Wheeled Vehicle (HMMWV); Antonis I. Antoniou et al, IEEE Mar. 2007, pp. 459-465.*

(Continued)

*Primary Examiner* — Akash Saxena
(74) *Attorney, Agent, or Firm* — Dykema Gossett PLLC

(57) ABSTRACT

In order to be able to simulate a development system of a complex development environment, such as a test bench environment for motor, drive train, transmission, vehicle component, or vehicle development, utilizing an automation device and development tools in a continuous and reproducible manner, device models (7) generating development data (23) run in a simulation device (6), wherein the device models (7) at least partially process simulation data (24) from a test model (20), and a number of real development tools (5) are connected to an automation device (4) and/or to the simulation device (6) via real interfaces, and development tools (5) process the development data (23).

18 Claims, 1 Drawing Sheet

(56) References Cited

U.S. PATENT DOCUMENTS

| | | | |
|---|---|---|---|
| 6,754,615 B1* | 6/2004 | Germann et al. | 703/8 |
| 7,908,123 B2 | 3/2011 | Maebayashi et al. | |
| 7,962,228 B2* | 6/2011 | Fukuda | 700/29 |
| 8,036,761 B2* | 10/2011 | Higuchi et al. | 703/8 |
| 2002/0029136 A1* | 3/2002 | Hagiwara et al. | 703/8 |
| 2003/0176991 A1* | 9/2003 | Abe | 703/8 |
| 2005/0187670 A1* | 8/2005 | Katayama et al. | 701/1 |
| 2006/0225710 A1 | 10/2006 | Taglialatela-Scafati | |
| 2007/0038422 A1* | 2/2007 | Wang et al. | 703/8 |
| 2007/0255482 A1* | 11/2007 | Fukuda | 701/99 |
| 2008/0275680 A1* | 11/2008 | Dato | 703/8 |
| 2008/0275682 A1* | 11/2008 | Langer | 703/8 |
| 2009/0012763 A1* | 1/2009 | Langer et al. | 703/8 |
| 2009/0132208 A1* | 5/2009 | Ukyo et al. | 703/1 |
| 2009/0306866 A1* | 12/2009 | Malikopoulos | 701/59 |
| 2010/0063790 A1* | 3/2010 | Truscott et al. | 703/8 |
| 2010/0088058 A1* | 4/2010 | Fricke | 702/113 |
| 2010/0100365 A1* | 4/2010 | Moriyama | 703/8 |
| 2010/0292974 A1 | 11/2010 | Krainz et al. | |
| 2012/0166154 A1* | 6/2012 | Johnson et al. | 703/2 |

FOREIGN PATENT DOCUMENTS

| | | |
|---|---|---|
| JP | 9185519 | 7/1997 |
| JP | 2004348596 | 12/2004 |
| WO | 0041050 | 7/2000 |

OTHER PUBLICATIONS

A Novel Model Validation and Estimation Approach for Hybrid Serial Electric Vehicles; Seta Bogosyan et al, IEEE Jul. 2007, pp. 1485-1497.*

R. Isermann et al., "Design of Computer Controlled Combustion Engines" in Mechatronics, vol. 13, No. 10 (Dec. 2003) pp. 1067-1089.

H. Hanselmann et al., "Real-Time Simulation Replaces Test Drives" in Test and Measurement World, vol. 16, No. 3 (Feb. 1996), pp. 35, 36, 38, 40.

English language translation of AT 505326 A2, dated Dec. 2008.

English language translation of DE 102007039691 A1, dated Feb. 2009.

English language Abstract of JP 9185519 dated Jul. 1997.

English language Abstract of JP 2004348596 dated Dec. 2004.

Pasquier et al. "Validating Simulation Tools for Vehicle System Studies Using Advanced Control and Testing Procedure", 2007.

Final Office action issued in U.S. Appl. No. 12/662,592 on May 14, 2012.

Non-Final Office Action issued in U.S. Appl. No. 12/662,592 on Oct. 11, 2013.

Non-Final Office Action issued in U.S. Appl. No. 12/662,592 on Nov. 22, 2011.

* cited by examiner

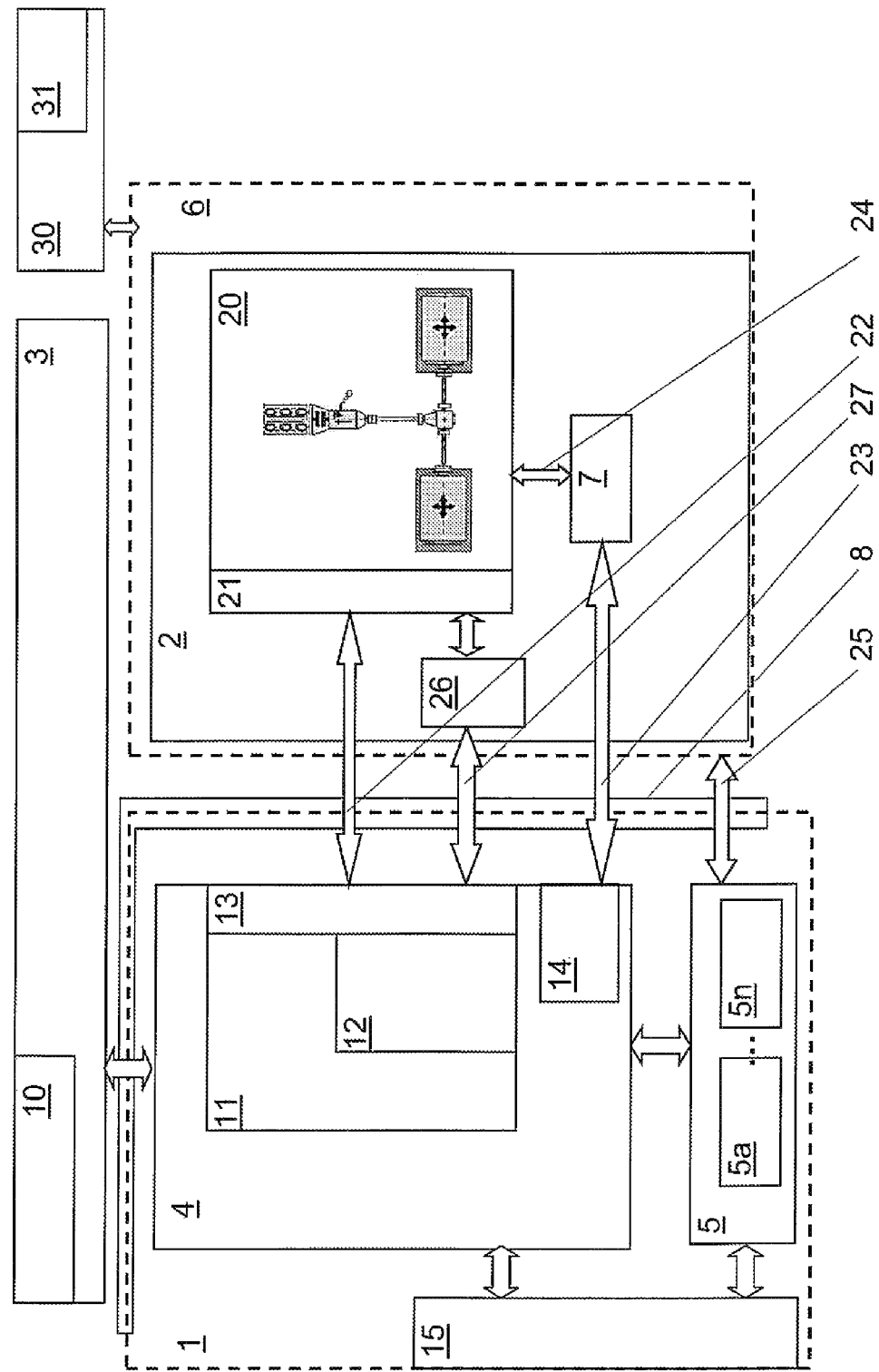

DEVICE AND METHOD FOR THE SIMULATION OF A DEVELOPMENT SYSTEM

BACKGROUND OF THE INVENTION

The present invention relates to a device and a method for the simulation of the configuration and the process in a development environment, comprising a development system for a test bench for a unit under test, and a simulation device, wherein a real automation device is provided in the development system for the operation of the test bench, the test bench and the unit under test in the simulation device are simulated by means of a test model generating simulation data, and the automation device and the simulation device are connected to each other via real interfaces of the development system, and the automation device processes generated simulation data.

(Further) improvements of motors, transmissions, motor trains, or entire vehicles, or parts thereof, are usually performed on special test benches, such as motor test benches, roller test benches, etc. For this purpose said test benches are controlled and regulated by dedicated automation systems, such as the PUMA series by the applicant, wherein in addition to the manual controls, fully automated test runs may, of course, also be generated and executed. However, such test benches are very complex technical units, which must be adapted to the respective application by means of respective configuration and parameterization. Therefore, each application requires its own configuration of the components needed, such as test bench HW and SW, measuring devices, indexing technology, data collection and analysis, development tools, etc. The efforts are increased by the fact that currently multiple test benches are in use parallel to each other (testing plants), and testing tasks are performed in parallel. The setup or new configuration of a test bench, and in particular of entire test facilities, therefore requires an enormous effort, which will have an effect on the operator during downtimes of several days. The breaking in period alone of the new SW version, such as the automation SW, poses a risk, since an estimate of whether all test bench components still interact with each other and function without error cannot be made.

Another problem is the creation of test processes wherein even simple new test processes may cause substantial problems due to the complexity of the systems during implementation at the operator's location. The creation and testing of test processes at the real test bench directly therefore also represents a cost-intensive and complex operation.

The necessary training of operating personnel is also not economically possible on real test benches, since a dedicated (expensive) training test bench must be provided for this purpose, or a test bench for this purpose will not be able to be operated productively. Furthermore, a training possibility would have to be available for each configuration.

It is therefore desirable to utilize simulators, by means of which a test bench can be simulated.

For this purpose a test device for industrial automation systems of a technical system is known from WO 00/41050A1. Said test device allows the modeling of the technical system and the connection of the same to the real control environment. In this manner a configurable technical system may be simulated in connection with the control environment. For this purpose the technical system is modeled in the form of responses of certain system parts to control signals of the control environment. Therefore, this enables the closing of real existing control loops via a simulator, on which the models are run. In this manner the behavior of an automation system of a technical system may be first tested. Training of the operating personnel is easily possible on such a simulator in a simple manner.

However, modern development environments, utilized in motor, drive train, transmission, vehicle components, or vehicle development, go far beyond a mere automation system for controlling a test bench. In particular, further development tools are required in addition to test stand automation, which enable the desired analyses of data obtained from the test bench or from the unit under test. For this purpose said data is collected by certain measuring devices in real time, and is usually irrelevant for automation, but is mainly required for the development task. For example, a motor as the unit under test of a test bench is equipped with a series of measuring devices, such as indexing devices having cylinder pressure transducers, emission measuring devices, consumption measuring devices, etc., which detect a plurality of motor data (such as of the combustion, emission data, consumption data, etc) during a test run for the development. Said detected data, of course, must be correspondingly analyzed for the development of the motor as a function of the operation of the motor (also as a function of the automation system). Another example of required development tools is the calibration tool. Calibration, for example, of the motor control unit, is a multi-dimensional task, caused by the ever increasing amount of actuators and variation parameters. Further tools are analysis tools, by means of which the results of the various development tools are mutually analyzed and re-processed.

A development environment therefore requires an error-free interaction of the automation environment with the additionally required development tools. In particular, since a development task requires an overall harmonized process of the systems involved, and the data processed all originates from the test bench or from the unit under test.

However, the mere simulation of the automation environment, as known from prior art, is not sufficient in order to be able to simulate the configuration and process of complex development environments. For this purpose the data generated for the automation system and for the development must be conformed to one other in order to be able to continuously simulate the development environment to enable plausibility tests and to ensure the repeatability of test runs.

It is therefore the object of the present invention to provide a device and a method, by means of which the configuration of and the process can be completely simulated in a development environment having a test bench for a unit under test, and a real automation system.

SUMMARY OF THE INVENTION

Said problem is solved by the invention in that a number of real development tools are provided in the development system, and device models generating development data and simulating the behavior of data collection devices are provided in the simulation device, wherein the device models at least partially process simulation data from the test model, and the development tools are connected to the automation device and/or the simulation device via real interfaces, and the development tools process the development data. The development tools therefore contain data generated by means of suitable device models for measuring devices from data of the test bench or unit under test simulation. In this manner the development tools and the automation device are supplied with consistent data being adjusted to one other during simulation. In this manner the configuration of, or a process in the development environment, may be tested or simulated continuously. In particular, it therefore also becomes possible to simulate the entire process from data collection up to data evaluation. This further ensures the reproducibility of a test run, and a (even in retrospect) possible plausibility testing of the result.

A host system may be advantageously provided, which is connected to the development system, by means of which it is possible to generate and manage test processes via the host system by means of suitable user interfaces, and/or to store or analyze test data or test processes, and/or to run predetermined test processes or configurations on the development system, and/or to connect multiple development systems or test benches to each other to form a test facility. For this purpose a database is advantageously provided in the host system, which enables a simple reproducibility of a test run.

A certain configuration of a simulation device having all test models, device models, hardware simulators, may be carried out by means of a simulation configurator in a very simple manner, by means of which the configuration and parameterization of the simulation environment is simplified. Further simplification may be obtained, if a test and/or device model database is provided in the simulation configurator, since prefabricated parts then only need to be assembled and optionally parameterized.

Certain test bench hardware, such as a stress machine, may not be sufficiently modeled by test models, for example, due to a high complexity of the hardware, or due to the highly dynamic behavior of the hardware during real-time operation. In order to be able to also sufficiently incorporate such hardware into the simulation in a manner that is as real as possible, a hardware simulator is preferably provided in the simulation device for the simulation of said test bench hardware. Utilizing such a hardware simulator, the real behavior may be simulated in an improved manner, than utilizing a software model.

BRIEF DESCRIPTION OF THE FIGURE

The present invention is described based on the schematically illustrated, non-limiting FIG. 1 showing a block diagram of a preferred development environment having a simulated test bench environment.

DETAILED DESCRIPTION OF THE PREFERRED EMBODIMENT

A development environment is illustrated in FIG. 1 by way of example, and includes a development system 1 and a test bench 2. The development system 1 includes an automation device 4 and a number of development tools 5, such as measuring data analysis, calibration tools, indexing measurement technology, etc. For this purpose the automation device 4 may, depending on the application, include different components in various combinations, such as in this case a vehicle simulation 11, a controller 12 of load machines (dynamometer), and/or a motor, interfaces 13 for the test bench 2, device drivers 14 for connected measuring devices, etc. A host system 3 may be connected upstream of the development system 1, which serves, for example, to generate and manage test processes via suitable user interfaces, to test and analyze test data or test processes in a database 10, to run stored test processes or configuration data on the development system 1, to connect multiple development systems 1 to each other, or to connect the test benches to form a test facility, etc.

Such a development system 1 is to be utilized to develop or further improve a unit under test located on a suitable test bench 2 in real time, for example, as indicated a complete drive train, or to subject the same to a certain test run, such as a fatigue test. In order to be able to first test the configuration of the development system 1, the invention provides to not construct the test bench 2 having all required component in a real manner, but to simulate, instead. For this purpose a simulation device 6, such as a suitable simulation hardware, i.e. dSpace® is provided, wherein the components of the test bench 2, such as motor, transmission, differential, shafts, and axles, dynamometer, etc., are reconstructed in the form of suitable test models 20. The test models 20 may be, for example, mathematical, physical model, and may be implemented in, for example, Matlab/Simulink®. However, there are no limitations with regard to the possible implementation of the test models 20 and the simulation hardware.

The development system 1 and the simulation device 6 are connected via an interface 8. The interface 8 corresponds to the real interface of the development system 1, which makes it possible to test the development system 1 in the real configuration of the same. The automation device 4 controls the test bench 2, or components thereof, via the interface 8, and receives data (i.e. measuring data) from the test bench 2, or from the individual test bench components in return. For this purpose respective data collection devices 21, such as measuring devices, are arranged in reality on the test bench 2. In the simulation device 6 the data collection devices 21 are reconstructed for detecting and generating the simulation data 22 by means of the test models 20.

Particularly for the purpose of connection of load machines, such as a dynamometer, hardware simulators (such as APA/FAGA simulators) 26 may also be utilized in the simulation device 6. Highly dynamic regulators, such as quick brake regulators, may run in real operation of the test bench 2 on said hardware simulators 26. The dynamics of the simulated hardware, such as of a load machine, is therefore simulated independently of the interface in the simulation model 20. In this manner it is possible both to utilize software and hardware of the development system 1 in real manner, and the dynamics of certain hardware, such as of a load machine, may be adjusted to the real test bench dynamics. The hardware simulator 26 may supply hardware simulation data 27 to the development system 1 via the interface 8. For this purpose the hardware simulator 26 may also be supplied with data from the test models 20, if necessary.

In addition to the simulation data 22 for the automation device 4, the development system 1 also requires further data, herein referred to as development data 23, for processing the required development tools 5. Said development data 23 may be simulation data 22 generated in the test models 20, but is usually data not required by the automation device 4, e.g. not required for regulating and controlling the test bench 2. However, said development data 23 is in fact generated directly by the test bench 2, or by the test bench components, or by the unit under test, and is therefore dependent on the simulation data 22. The dependency should be construed such that a certain test bench or unit under test state certainly also requires certain development data 23. In order to be able to test the entire development system 1 utilizing a test bench simulation, it is therefore necessary that the simulation data 22 and the development data 23 conforms and is consistent. In order to ensure this, device models 7 are implemented in the simulation device 6, which simulate the behavior of further data collection devices, such as further measuring devices. For this purpose said device models 7 have simulation data 24 from the test models 20 as input. Said simulation data 24 may simultaneously (at least partially) also be simulation data 22, which is exchanged with the automation device 4. Furthermore, it is of course also possible that the device models 7 have a further input, such as other internal or external data sources. The development data 23 generated in the device models 7 reaches the development system 1 via the interface 8, and reaches the development system 1 via optionally existing device drivers 14, or reaches the development tools 5 via internal interfaces in the development system 1. Of course, it is also possible that the development tools 5 are directly connected to the simulation device 6 for exchanging simulation data and/or development data 25 via the interface 8.

The simulation device 6 may also be adjusted to the different types of test benches, such as motor test bench, transmission test bench, roller test bench, by means of simple configuration. E.g. different test bench components may be combined in the form of test models 20 and device models 7, and may be parameterized according to the requirements. In this manner the development system 1 may be simulated for different development purposes and various types of test benches. For this purpose, for example, a simulation configurator 30 having respective I/O units, such as a PC, may be provided. Models of certain types of test benches and/or components thereof, and/or of certain measuring devices may be stored in the same in a test and/or device model database 31, which may be retrieved, combined, and parameterized. For this purpose the simulation configurator 30 may, of course, also be integrated in the host system 3.

A generally known I/O interface 15, having respective input and/or output device, may also be provide in the development environment, via which the automation device 4 and/or the development tools 5, and/or the test bench 2 may be contacted, controlled, or via which feedback may be provided by said components. Such I/O interfaces 15 are known from real development environments, and also from many other applications. For this purpose the I/O interface 15 may be embodied as a human-machine interface, or also as a machine-machine interface. Such an I/O interface 15 could comprise, for example, a sufficiently known

- unit for an audio feedback, such as an audio output for the output of, for example, measuring values or operating parameters, or an output of acoustic signals, such as acoustic warning signals, sounds, etc., and/or a
- unit for the acoustic command input, such as by means of voice recognition, whistles, clapping, or the like, and/or a
- unit for visual feedback, such as an image output, a parameter-dependent staining of image screen areas, the controlling of a work space illumination, blinking lights, display signals, etc., and/or a
- unit for the optical input, such as by means of pupil observation, by means of detecting the movement of certain body parts, such as a hand or an arm, by means of laser pointer, etc., and/or a
- unit for haptic feedback, such as by means of vibrating a control lever, by means of the movement of a seat or a lever, etc., and/or a
- unit for the mechanical input, such as by means of buttons, levers, regulators, keyboards, computer mouse, touch screens, etc., and/or a
- unit for thermal feedback, such as by means of a temperature change of a control lever or a seat, etc.

For this purpose the I/O interface 15 may be supplied with respective signals or data via the automation device 4 and/or the development tools 5, or transmit signals or data via said components. Of course, the I/O interface 15 may also directly receive and further process data from the test bench 2, or from the simulation device 6, such as simulation data 22 or development data 23. Any desired simple control that is adjustable to the respective application, or any simple output of signals or data is possible from the development system, or from individual parts via such an I/O interface 15.

The invention claimed is:

1. A device for the simulation of the configuration and the process in a development environment, said development environment comprising:
    a development system (1) with a real automation device (4) for controlling and regulating a test run of a test bench (2) on which for a unit under test is arranged_and with a number of real development tools (5) for analyzing data obtained from the test bench (2) or from the unit under test;
    a simulation device (6) comprising
        a test model (20) for simulating the test bench (2) and the unit under test, whereas said test model (20) generates simulation data (22, 24);
        a plurality of device models (7) for simulating behavior of data collection devices, whereas said device models (7) at least partially process simulation data (24) from the test model (20) and generate development data (23, 25);
    said real automation device (4) and said simulation device (6) being connected to each other via a real interface (8) of the development system (1) and the automation device (4) processes generated simulation data (22) received via the interface (80); and
    said real development tools (5) are connected to the automation device (4) and/or to the simulation device (6) via real interfaces and receive and process the development data (23, 25);
    wherein said simulation device (6) includes a simulation of a dynamometer of said test bench (2).

2. The device according to claim 1, including a host system (3) which is connected to the development system (1).

3. The device according to claim 2, including a database (10) in the host system (3).

4. The device according to claim 1, including a simulation configurator (30).

5. The device according to claim 4, including a test and/or device model database (31) in the simulation configurator (30).

6. The device according to claim 1, including a hardware simulator (26) in the simulation device (6) for the simulation of certain test bench hardware.

7. The device according to claim 1, including an I/O interface (15) which is connected to at least one of the automation device (4), a development tool (5), and the simulation device (6).

8. The device according to claim 1, wherein the data collection devices include a transducer.

9. The device according to claim 1, wherein the data collection devices comprise at least one of a cylinder pressure transducer, an emission measuring device, and a consumption measure device.

10. The device according to claim 1, wherein the real automation device (4) includes a dynamometer controller.

11. In a device for the simulation of the configuration and the process in a development environment, said development environment comprising:
    a development system (1) with a real automation device (4) for controlling and regulating a test run of a test bench (2) on which for a unit under test is arranged and with a plurality of real development tools (5) for analyzing data obtained from the test bench (2) or from the unit under test;
    a simulation device (6) comprising
        a test model (20) for simulating the test bench (2) and the unit under test, whereas said test model (20) generates simulation data (22, 24);

a plurality of device models (7) for simulating behavior of data collection devices, whereas said device models (7) at least partially process simulation data (24) from the test model (20) and generate development data (23, 25), said data collection devices including a measuring device;

said real automation device (4) and said simulation device (6) being connected to each other via a real interface (8) of the development system (1) and the automation device (4) processes generated simulation data (22) received via the interface (80); and said real development tools (5) are connected to the automation device (4) and/or to the simulation device (6) via real interface and receive and process the development data (23, 25), comprising the steps of:

running the device models in the simulation device for generating development data and simulating behavior of data collection devices;

processing simulation data from the test model (20) in the device models; and processing development data in the development tools (5).

12. The method according to claim 11, including simulating certain test bench hardware in a hardware simulator (26) in the simulation device (6).

13. The method according to claim 11, including creating a configuration of a simulation device (6) utilizing a simulation configurator (30).

14. The method according to claim 11, including generating and managing test processes via a host system by means of suitable user interfaces, and/or storing or analyzing test data or test processes, and/or running stored test processes or configuration data on the development system (1), and/or connecting multiple development systems (1) or test benches (2) to each other to form a test facility.

15. The method according to claim 11, including transmitting data or signals to at least one of the automation device (4), a development tool (5), the simulation device (6), or received by the same, via an I/O interface (15).

16. The method according to claim 11, wherein the measuring device comprises a transducer.

17. The method according to claim 11, wherein the measuring device comprises at least one of a cylinder pressure transducer, an emission measuring device, and a consumption measure device.

18. A device for the simulation of the configuration and the process in a development environment, said development environment comprising:

a development system (1) with a real automation device (4) for controlling and regulating a test bench (2) for a unit under test and with a number of real development tools (5) for analyzing data obtained from the test bench (2) or from the unit under test;

a simulation device (6) comprising a test model (20) for simulating the test bench (2) and the unit under test, whereas said test model (20) generates simulation data (22, 24) the test bench comprising at least one of a motor test bench and a roller test bench;

a plurality of device models (7) for simulating behavior of data collection devices, whereas said device models (7) at least partially process simulation data (24) from the test model (20) and generate development data (23, 25);

a hardware simulator (26) in the simulation device (6) for the simulation of certain test bench hardware;

said real automation device (4) and said simulation device (6) being connected to each other via a real interface (8) of the development system (1) and the automation device (4) processes generated simulation data (22) received via the interface (80); and said real development tools (5) are connected to the automation device (4) and/or to the simulation device (6) via real interfaces and receive and process the development data (23, 25).

* * * * *

UNITED STATES PATENT AND TRADEMARK OFFICE
CERTIFICATE OF CORRECTION

| | | |
|---|---|---|
| PATENT NO. | : 8,825,460 B2 | Page 1 of 1 |
| APPLICATION NO. | : 12/452011 | |
| DATED | : September 2, 2014 | |
| INVENTOR(S) | : Walenta et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 630 days.

Signed and Sealed this
Fifteenth Day of September, 2015

Michelle K. Lee
*Director of the United States Patent and Trademark Office*

UNITED STATES PATENT AND TRADEMARK OFFICE
CERTIFICATE OF CORRECTION

PATENT NO. : 8,825,460 B2  Page 1 of 1
APPLICATION NO. : 12/452011
DATED : September 2, 2014
INVENTOR(S) : Walenta et al.

It is certified that error appears in the above-identified patent and that said Letters Patent is hereby corrected as shown below:

On the Title Page, item (22)

The date of the PCT application should be --June 9, 2008-- and not "Sep. 6, 2008".

Signed and Sealed this
Ninth Day of February, 2016

Michelle K. Lee
*Director of the United States Patent and Trademark Office*